(12) United States Patent
Helms

(10) Patent No.: US 6,996,378 B2
(45) Date of Patent: *Feb. 7, 2006

(54) TRANSMITTER

(75) Inventor: Jochen Helms, Munich (DE)

(73) Assignee: Siemens Aktiengesellschaft, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/112,269

(22) Filed: Jul. 8, 1998

(65) Prior Publication Data

US 2001/0014592 A1  Aug. 16, 2001

(30) Foreign Application Priority Data

Jul. 8, 1997  (DE) ......................................... 197 29 182

(51) Int. Cl.
  *H04B 1/10* (2006.01)
  *H04B 1/02* (2006.01)

(52) U.S. Cl. .......................... 455/91; 455/63; 455/126; 375/296

(58) Field of Classification Search .................... 455/91, 455/118, 126, 63, 561, 119, 103, 104; 375/296, 375/297; 330/149
See application file for complete search history.

(56) References Cited

U.S. PATENT DOCUMENTS

| | | | | |
|---|---|---|---|---|
| 5,732,333 A | * | 3/1998 | Cox et al. ................... | 455/126 |
| 5,748,678 A | * | 5/1998 | Valentine et al. ........... | 375/297 |
| 5,870,668 A | * | 2/1999 | Takano et al. .............. | 455/126 |
| 5,903,823 A | * | 5/1999 | Moriyama et al. .......... | 455/126 |
| 5,920,808 A | * | 7/1999 | Jones et al. ................. | 455/126 |
| 5,923,712 A | * | 7/1999 | Leyendecker et al. ...... | 455/126 |
| 5,929,703 A | * | 7/1999 | Sehier et al. ............... | 455/126 |
| 5,937,011 A | * | 8/1999 | Carney et al. ............... | 455/63 |

FOREIGN PATENT DOCUMENTS

DE  38 20 985 C2  2/1990
EP  0 688 108 A2  12/1995

OTHER PUBLICATIONS

IEEE Transaction on Vehicular Technology, vol. 45, No. 4, Nov. 1996—p. 706–719.

IEEE Transaction on Vehicular Technology, vol. 43, No. 2, May 1994, pp. 406–413.

* cited by examiner

*Primary Examiner*—William Trost
*Assistant Examiner*—Simon Nguyen
(74) *Attorney, Agent, or Firm*—Bell Boyd & Lloyd LLC

(57) ABSTRACT

A transmitter for a plurality of carriers of a broad-band transmitting spectrum which contains a broad-band power amplifier encompassing the carriers for amplifying an input signal into a more powerful output signal, wherein a measuring signal is formed from the output signal with the aid of a decoupler. The transmitter further contains an adaptation unit for comparing the input signals to the measuring signals and for thereafter forming a correction signal. A predistortion of the input signal is performed in a predistortion unit in the transmitter corresponding to the setpoint selections of the correction signal.

10 Claims, 3 Drawing Sheets

TRANSMITTER

BACKGROUND OF THE INVENTION

1. Field of the Invention

The present invention relates to a transmitter for a plurality of carriers of a broad-band transmission spectrum.

2. Description of the Prior Art

Transmitters of the afore-mentioned type are preferably utilized in radio stations within mobile radio networks in which a transmission of information to further radio stations occurs in a plurality of carriers with the aid of radio-frequency signals. These radio stations are base stations which are stationary and which carry out information transmission to mobile stations, for example. In a transmitter, input signals are amplified into more powerful output signals and are converted into a corresponding transmitting frequency.

If a broad-band transmitting spectrum with a plurality of carriers is amplified, linearity problems of amplification arise. In order to keep the power efficiency of the power amplifier within the transmitter high, the latter is usually operated in AB, B or C mode. However, these modes are distinguished by highly non-linear behavior which results in a poor intermodulation suppression. Without suitable linearizing processes, such power amplifiers in transmitters with a plurality of carriers are not suitable when a minimal intermodulation suppression is required.

It is generally known to amplify each carrier individually and, thus, to maintain the linearity. The transmitter is then not broad-band, however, and must be correspondingly frequently made available in the radio station. In the carrier-specific amplification, a merging of the carriers occurs at the amplifier output by means of hybrids, filters or antennas. The individual amplification branches are shielded from each other by insulators. Harmonic distortions are suppressed by transmitting filters.

K. J. Parson, P. B. Kenington, "The efficiency of a feed-forward amplifier with delay loss", IEEE Trans. on Vehicular Techn., Vol. 43, May 1994, pages 407–412 teaches to perform the linearizing of a broad-band transmitting spectrum for a plurality of carriers with the aid of a "feed forward" method. A loop of a main amplifier and an error amplifier is therein constructed. The error amplifier amplifies only the intermodulation distortions of the main amplifier, wherein such distortions are subsequently subtracted from the output signal of the main amplifier. The disadvantages of this method are a) the necessary analog tuning precision in rate and phase at the summation points, and b) a lower power efficiency resulting from the utilization of two amplifiers, from the loss of couplers and from the loss of delay units. At the moment, however, this method only approximately achieves the intermodulation suppressions required by the GSM (Global System for Mobile Communication) mobile radio system in a double loop execution.

SUMMARY OF THE INVENTION

It is consequently an object of the present invention to propose a transmitter for a plurality of carriers of a broad-band transmitting spectrum which has a higher power efficiency. Accordingly, the transmitter of the present invention contains a broad-band power amplifier encompassing the carriers for amplifying an input signal into a more powerful output signal. As such, a measuring signal is formed from the output signal with the aid of a decoupler. The transmitter further contains an adaptation unit for comparing input signals and measuring signals as well as for forming a correction signal. In a predistortion unit which likewise belongs to the transmitter, a predistortion of the input signal is performed which corresponds to the setpoint selections of the correction signal.

Through this linearizing of the multicarrier transmitter with the aid of adaptive predistortion, the input signal is predistorted to compensate for the nonlinearity of the subsequent power amplifier and other units. In a broad-band transmitting spectrum with a plurality of carriers, intermodulation products arise in the modulation which can be suppressed through adaptive predistortion. Additional losses are low and the power efficiency of the transmitter is greater than in a carrier-related amplification.

Unlike in modulation methods with constant envelope, such as the GMSK modulation for GSM mobile radio networks which do not require a linear amplifier for the input amplification, these intermodulation products represent an additional problem for the transmitter in a transmitting spectrum with a plurality of carriers. This problem can be solved by the present invention in an economical fashion.

According to another embodiment of the present invention, the predistortion unit consists of carrier-related predistortion units which act on input signals of the individual carriers that are subsequently merged into the input signal. Each carrier can thus be individually predistorted, resulting in a high degree of predistortion flexibility.

These carrier-related predistortion units are advantageously constructed for digital signal processing so that digitized carrier-related input signals can be processed. Further analog switching elements for predistortion are thus no longer needed and the correction signal or signals can be calculated easily.

According to a further embodiment of the present invention, the carrier-related predistortion units act on an in-phase component and a quadrature component of digitized carrier-related input signals. The transmitter therein additionally includes a digital upward conversion unit which converts the predistorted carrier-related input signals into an intermediate frequency prior to the merging into the input signal. The predistortion can thus take place in the base band and does not require any radio frequency components.

It is also advantageous to digitize the measuring signal with an analog/digital converter and to feed it to the adaptation unit. The adaptation unit thus also can be configured as a digital signal processor. Corresponding to the upward conversion unit, a downward conversion unit advantageously can be provided which converts the digitized measuring signal into the base band for further processing in the adaptation unit.

The digital signal processing in the adaptation unit is further simplified if the measuring signal is also converted into carrier-related digital measuring signals corresponding to the carrier-related input signals; for example, through a digital downward conversion unit which is constructed in a carrier-related fashion. Through such a configuration of the inventive transmitter, a complete digital processing and predistortion is possible. This configuration also has the advantage that, in addition to the nonlinearity of the power amplifier, the nonlinearity of a few components can be modulated and equalized with the aid of the predistortion unit. The error of the feedback branch with the measuring signal should be known, however.

According to a further embodiment of the present invention, the transmitting unit contains a storage unit for storing the correction signal which is defined by the adaptation unit and which is utilized for a subsequent input signal. A radio transmission often occurs in radio blocks; for example, in TDMA (Time Division Multiple Access) access methods. Following the evaluation of a radio block and the defined nonlinearities, the correction signal is applied to the subsequent input signal; i.e., subsequent symbols or the subsequent radio block. A constant follow-up of the predistortion is thus possible.

A storage unit can also be used for storing certain intermodulation products of frequencies present in the transmitter. Since all frequencies present in the system (carrier frequencies and cycles) are known (in contrast to broadband receivers), the position and order of the arising intermodulation distortions can be calculated in advance. The predistortion can then be concentrated on these predictable intermodulation distortions. Defined intermodulation products can serve the adaptation unit as adaptation criteria for the predistortion.

Through the transmitter portrayed, a higher power efficiency is achieved and, through the extensive digitizing, the outlay for equalization of the analog circuit is relatively low. The essential nonlinearities of the transmission path are summarily compensated. A splitting and thus an intensifying of the total demand with respect to the intermodulation suppression is not necessary. The higher outlay in the digital signal processing and storage carries less importance due to the expected technological progress and the price decrease for these technologies.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
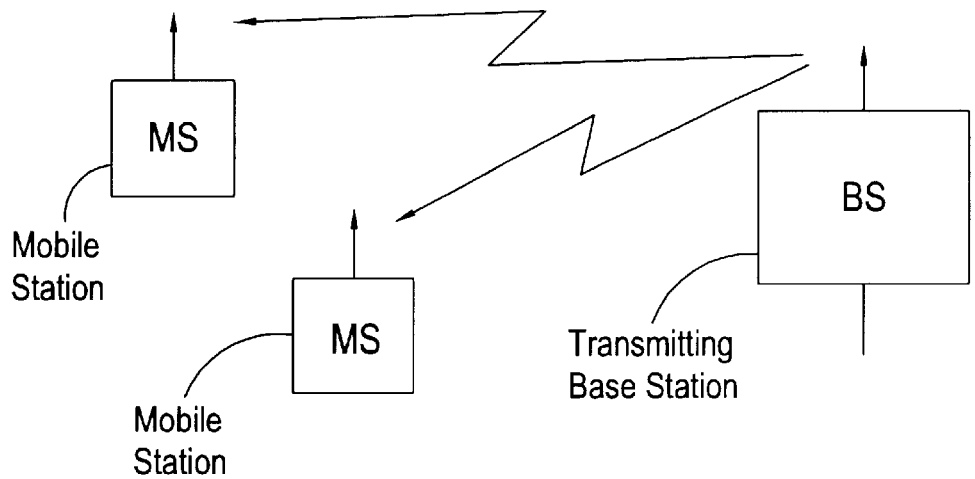
FIG. 1 shows a block wiring diagram of the radio transmission between a base station and mobile stations.
Figure 2:
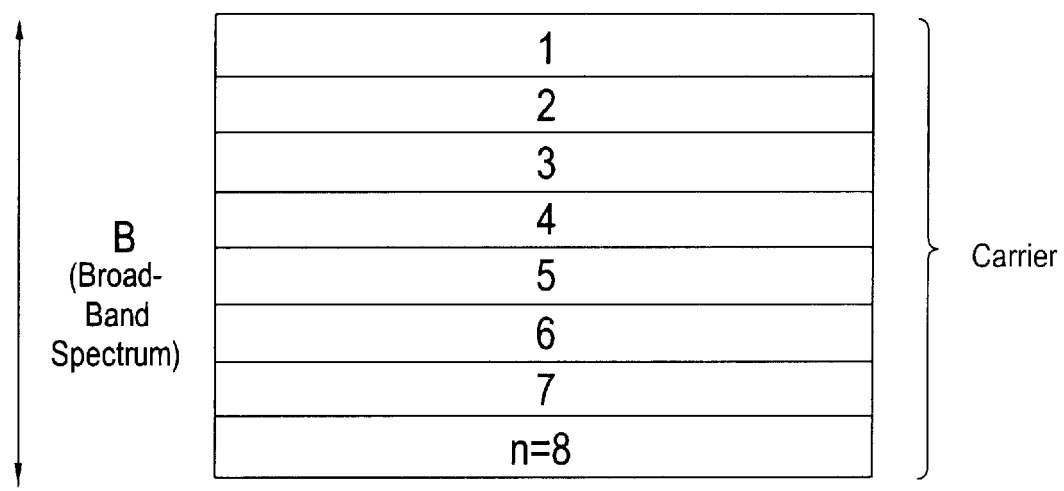
FIG. 2 shows a schematic representation of the splitting of the broad-band spectrum.

FIG. 1 shows the information transmission from a transmitting base station BTS to mobile stations MS. The base station BTS contains a transmitter which creates a broad-band transmission signal. The broad-band transmission signal includes a spectrum B, for example B=1.6 MHZ, in which a plurality of carriers 1, 2, . . . , n=8 (see FIG. 2) are simultaneously contained. Two mobile stations MS can thus be served on different carriers simultaneously, for example.

Figure 3:
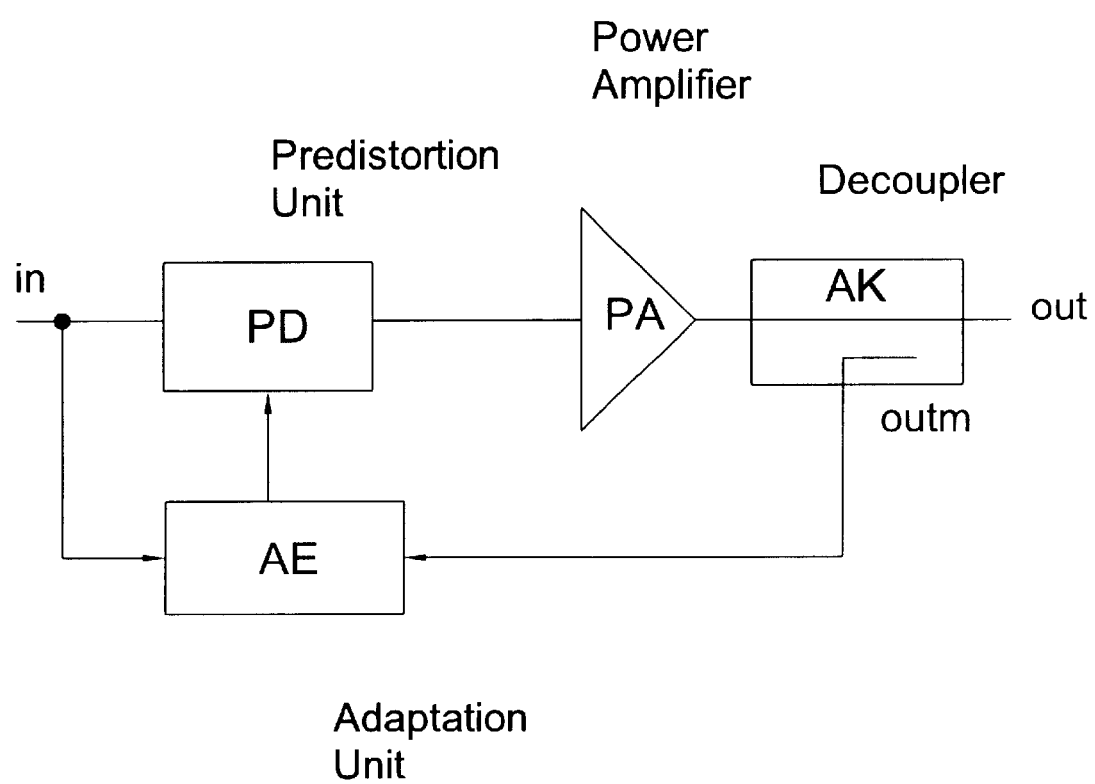
FIG. 3 shows a block wiring diagram of a transmitter.

FIG. 3 shows a block wiring diagram of the transmitter which contains a predistortion unit PD, a power amplifier PA, a decoupler AK and an adaptation unit AE. An input signal in is fed to the predistortion unit PD and to the adaptation unit AE. The predistortion unit PD performs a predistortion of the input signal in whereby setpoint selections of a correction signal c created by the adaptation unit AE are followed. The predistorted input signal is amplified in the power amplifier PA, whereby the distortion of the power amplifier PA is anticipated by the predistortion and equalized through corresponding corrections. L. Sundström et al, "Quantization analysis and design of a digital predistortion linearizer for RF power amplifiers," IEEE Trans. on Vehicular Technol., Vol. 45, November 1996, pp. 707–719 teaches methods for digital correction, but only for a carrier frequency and without consideration of intermodulation disturbances.

At the output of the power amplifier PA lies an output signal out. From the output signal out, a measuring signal outm is created with the aid of the decoupler AK. The decoupler AK is configured as a directional coupler; for example, as one which decouples a small part of the transmission power.

In addition to the input signal in, the measuring signal outm is evaluated in the adaptation unit AE. A comparison of the input signal in with the measuring signal outm is performed in the adaptation unit, the distortions are amplified through the power amplifier PA and the other components are derived therefrom. For equalization of these distortions, a correction signal c is formed which is evaluated by the predistortion unit PD and which sets the latter's predistortion.

Figure 4:
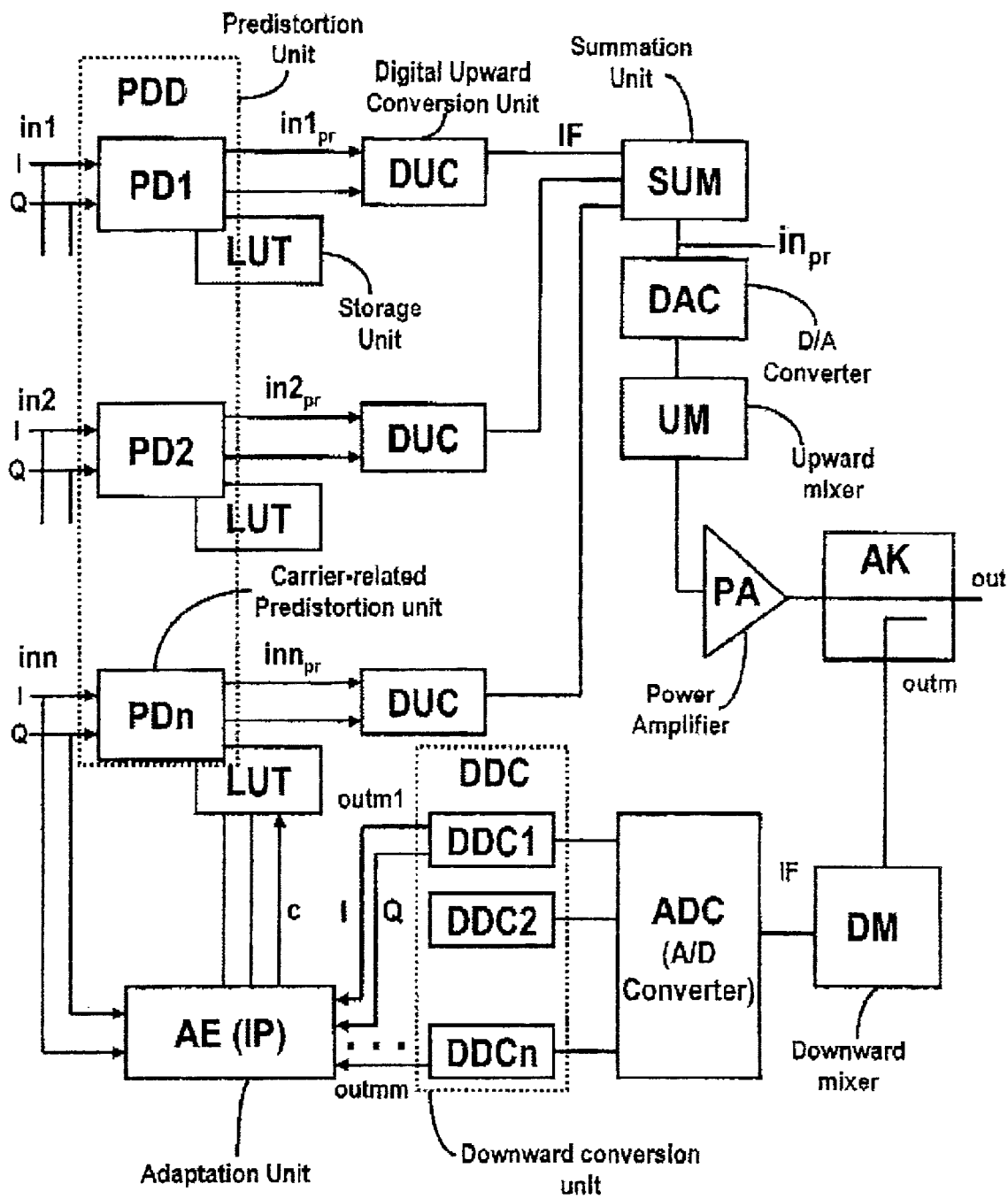
FIG. 4 shows a detailed block wiring diagram of a transmitter.

FIG. 4 shows the transmitter in greater detail wherein the input signal of the transmitter consists of carrier-related input signals in1, in2, . . . , inn. These carrier-related input signals in1 to inn are digitized. Consequently, they consist of an in-phase component I and a quadrature component Q. The carrier-related input signals in1 to inn are therein allocated to the carriers 1 to n according to FIG. 2.

The predistortion unit PD is also constructed in a carrier-related fashion in carrier-related predistortion units PD1, PD2, . . . , PDn, which process the input signals in1 to inn. The predistortion of the input signals in1 to inn are set corresponding to the setpoint selections of a storage unit LUT.

Such a storage unit LUT is allocated to every carrier-related predistortion unit PD1, PD2, . . . , Pdn. Alternatively, it is also possible to provide a central storage unit LUT. The values of the carrier-specific correction signals c are stored in the storage unit LUT. The predistortion into predistorted input signals $in1_{pr}$, $in2_{pr}$, . . . , $inn_{pr}$ occurs according to the setpoint selections of the correction signals c. These are further digitized signals which are subsequently fed to carrier-related, digital upward conversion units DUC.

These digital upward conversion units DUC perform a shift to a digital intermediate frequency IF. The digital data currents of the intermediate frequency IF are subsequently added up to the predistorted input signal $in_{pr}$ in the summation unit SUM. A subsequent digital/analog converter DAC converts the signal of the intermediate frequency IF into an analog signal which is subsequently modulated in an upward mixer UM and converted into the transmitting frequency. Upstream and downstream relative to the upward mixer UM, band filters (not shown) are used to limit the corresponding frequency band. This signal is subsequently fed to the power amplifier PA which performs a power amplification and emits the output signal out.

As already explained, the decoupler AK performs a decoupling of a measuring signal outm from the output signal out, whereby the measuring signal outm is fed to a downward mixer DM which, corresponding to the upward converter UM, initially converts the measuring signal outm into the intermediate frequency and then band-filters the signal. Band filters are advantageously utilized upstream and downstream relative to the downward converter. There is also an analog/digital conversion in an analog/digital converter ADC.

The measuring signal outm is subsequently processed by downward conversion units DDC1, DDC2, . . . , DDCn.

These downward conversion units DDC1, DDC2, ..., DDCn convert suitable intermodulation products, or carriers, into complex base band and make available carrier-related, or intermodulation-related, measuring signals outm1 to outmn of the adaptation unit AE. Using a comparison of the input signals in1 to inn and the measuring signal outm1 to outmn, the adaptation unit AE calculates correction signals which are emitted as correction data c to the storage unit LUT. The correction data defined in the evaluation of processed symbols of a radio block are subsequently used in the amplification of subsequent symbols for predistortion. The correction data c are optimally current therein.

If the bandwidth of the available components is not sufficient to cover the desired total bandwidth (e.g., E-GSM: 35 MHZ), the total band is divided into partial bands. The block wiring diagram according to FIG. 4 then applies per partial band.

Amplitude offset errors and DC offset errors are avoided through the utilization of digital upward and downward mixers UM, DM, respectively. The adaptation is thus not corrupted by these errors. A very good linearity can be reached despite a high power efficiency through the summary modeling of the non-linearities in the transmission path not only of the power amplifier PA, but also of the remaining components DUC, SUM, DAC and UM. Adaptation criteria for the predistortion are available due to the selection of suitable intermodulation products IP which are taken into consideration by the adaptation unit AE. Since the frequencies used in the system are known, the intermodulation products IP can be prescribed ahead of time.

Although the present invention has been described with reference to specific embodiments, those of skill in the art will recognize that changes may be made thereto without departing from the spirit and scope of the invention as set forth in the hereafter appended claims.

I claim as my invention:

1. A transmitter for a plurality of carriers of a broad-band transmitting spectrum, wherein a plurality of carrier-specific baseband input signals are repsectively associated with the plurality of carriers, the transmitter comprising:

a broad-band power amplifier encompassing the plurality of carriers and amplifying an input signal into a more powerful output signal;

a decoupler for forming a measuring signal from the output signal received from the power amplifier;

an adaptation unit for, while the transmitter is in operation, dynamically comparing the plurality of carrier-specific baseband input signals to a respective plurality of carrier-specific measuring signals and thereafter dynamically forming a respective plurality for carrier-specific correction signals, wherein the plurality of carrier-specific measuring signals are derived from the measuring signal and relate to indermodulation frequencies in the transmitter; and a predistortion unit formed of a plurality of carrier-specific predistortion units which respectively, while the transmitter is in operation, dynamically predistort the plurality of carrier-specific baseband input signals corresponding to respective setpoint selections of the respective plurality of carrier-specific correction signals, wherein the predistorted plurality if carrier-specific baseband input signals are subsequently merged to form the input signal.

2. A transmitter as claimed in claim 1, wherein:

the plurality of carrier-specific predistortion units perform a digital signal processing of digitized carrier-specific input signals.

3. A transmitter as claimed in claims 1, wherein:

the carrier-specific predistortion units act on in-phase and quadrature components of digitized carrier-specific input signals; and a digital upward conversion unit converts the plurality of predistorted carrier-specific input signals into an intermediate frequency prior to the plurality of predistorted carrier-specific input signals being merged into the input signal.

4. A transmitter as claimed in claim 1, further comprising:

an analog/digital converter for digitizing the measuring signal.

5. A transmitter as claimed in claim 4, further comprising:

a digital downward conversion unit for further processing the digitized measuring signal in the adaptation unit.

6. A transmitter as claimed in claim 5, wherein:

the digital downward conversion unit is constructed in a carrier-specific fashion to emit the plurality of carrier-specific measuring signals.

7. A transmitter as claimed in claim 5, wherein:

the digital downward conversion unit is constructed in a fashion related to intermodulation products to emit digital measuring signals which are related to intermodulation products.

8. A transmitter as claimed in claim 7, wherein:

intermodulation products defined by the adaptation unit are utilized as adaptation criterion.

9. A transmitter as claimed in claim 1, further comprising:

at least one storage unit for storing the plurality of carrier-specific correction signals defined by the adaptation unit wherein the plurality of correction signals may be employed for the plurality of carrier-specific input signals.

10. A transmitter as claimed in claim 1, further comprising:

at least one storage unit for storing intermodulation products of frequencies present in the transmitter.

* * * * *